(12) United States Patent
Jakubowicz et al.

(10) Patent No.: US 10,505,332 B1
(45) Date of Patent: Dec. 10, 2019

(54) EX-SITU CONDITIONING OF LASER FACETS AND PASSIVATED DEVICES FORMED USING THE SAME

(71) Applicant: II-VI Delaware, Inc., Wilmington, DE (US)

(72) Inventors: Abram Jakubowicz, Pfaeffikon SZ (CH); Martin Sueess, Zurich ZH (CH)

(73) Assignee: II-VI Delaware, Inc., Wilmington, DE (US)

( * ) Notice: Subject to any disclaimer, the term of this patent is extended or adjusted under 35 U.S.C. 154(b) by 0 days.

(21) Appl. No.: 16/406,313

(22) Filed: May 8, 2019

Related U.S. Application Data

(63) Continuation-in-part of application No. 15/996,614, filed on Jun. 4, 2018.

(51) Int. Cl.
*H01S 5/028* (2006.01)
*H01S 3/06* (2006.01)
*H01S 3/08* (2006.01)

(52) U.S. Cl.
CPC ........ *H01S 3/0619* (2013.01); *H01S 3/08059* (2013.01); *H01S 5/0282* (2013.01)

(58) Field of Classification Search
CPC .... H01S 5/2202; H01S 5/0283; H01S 5/1082; H01S 5/028
USPC ....................................... 257/436; 372/49.01
See application file for complete search history.

(56) References Cited

U.S. PATENT DOCUMENTS

| | | | |
|---|---|---|---|
| 5,063,173 A | 11/1991 | Gasser et al. | |
| 5,665,637 A | 9/1997 | Chand | |
| 6,519,272 B1 | 2/2003 | Baliga et al. | |
| 6,571,041 B2 * | 5/2003 | Bourcier | G02B 6/4226 359/822 |
| 6,618,409 B1 | 9/2003 | Hu et al. | |
| 6,812,152 B2 | 11/2004 | Lindstrom et al. | |
| 6,980,579 B2 | 12/2005 | Jewell | |
| 7,687,291 B2 | 3/2010 | Charache et al. | |
| 7,763,485 B1 | 7/2010 | Dimitrov et al. | |
| 8,111,727 B2 | 2/2012 | Harder et al. | |
| 8,277,877 B1 | 10/2012 | Dimitrov et al. | |
| 2003/0011899 A1* | 1/2003 | Bourcier | G02B 7/023 359/813 |
| 2006/0193360 A1 | 8/2006 | Yamanaka | |
| 2012/0062972 A1* | 3/2012 | Idaka | B23K 26/082 359/205.1 |
| 2016/0377874 A1* | 12/2016 | Zhou | G02B 27/0927 359/569 |

* cited by examiner

*Primary Examiner* — Tuan N Nguyen
(74) *Attorney, Agent, or Firm* — Wendy W. Koba

(57) ABSTRACT

Edge-emitting laser diodes having mirror facets include passivation coatings that are conditioned using an ex-situ process to condition the insulating material used to form the passivation layer. An external energy source (laser, flash lamp, e-beam) is utilized to irradiate the material at a given dosage and for a period of time sufficient to condition the complete thickness of passivation layer. A process for training (calibrating) a laser-based ex-situ conditioning system provides three-dimensional spatial alignment between the focused beam and a defined location on the edge-emitting laser diode surface, while also determining an optimum performance window (in terms of power density and exposure interval) for efficient and effective conditioning.

14 Claims, 11 Drawing Sheets

EX-SITU CONDITIONING OF LASER FACETS AND PASSIVATED DEVICES FORMED USING THE SAME

CROSS-REFERENCE TO RELATED APPLICATIONS

This application is a continuation-in-part of U.S. patent application Ser. No. 15/996,614, filed Jun. 4, 2018 and herein incorporated by reference.

TECHNICAL FIELD

The present invention relates to laser devices and, more particularly, to edge-emitting laser diodes having mirror facets that are conditioned using an ex-situ process.

BACKGROUND OF THE INVENTION

High power semiconductor laser diodes have become important components in the technology of optical communication, particularly because such laser diodes can be used for fiber pumping (amplification of optical signals) and other high-power applications. In most cases features such as long lifetime, reliable and stable output, high output power, high electro-optic efficiency, and high beam quality are generally desirable. One key for the long-term reliability of modern high-power laser diodes depends on the stability of the laser facets cleaved to form the opposing mirrors of the laser cavity.

The physical degradation of laser facets is a complex reaction that can be driven by light, current, and heat, resulting in power degradation and, in severe cases, to catastrophic optical damage (COD) of the mirror surfaces themselves. A process developed by IBM and referred to as "E2 passivation" has been used to address these concerns and minimize the possibility of COD. As described in IBM's U.S. Pat. No. 5,063,173 entitled "Method for Mirror Passivation of Semiconductor Laser Diodes" issued to M. Gasser et al., the E2 process involves the deposition of a layer of silicon (or perhaps germanium or antimony) as a coating over the bare facet (mirror) surfaces. The presence of the coating functions as a passivation layer, protecting the underlying facet.

Today's laser diodes may be operated at a relatively high power (and perhaps also for extended periods of time) in many applications. The conventional passivation layers, as deposited, may break down under these conditions and allow for damage of the mirror surfaces to occur. Therefore, in order to obtain high quality infrared high power laser diodes, it has now become a standard practice to "condition" the passivation layer. As performed today, conditioning is an extremely time-consuming process that requires operating the laser diode at a reduced current level for a prolonged period of time so as to form a crystalline structure inside the as-deposited amorphous passivation layer, forming a stable interface between the passivation layer and the mirror facet. Besides the time period required for this conditioning process, it is necessarily performed on a device-by-device basis, further extending the time and expense of the fabrication process.

SUMMARY OF THE INVENTION

The need to reduce the time required for laser facet conditioning is addressed by the present invention, which relates to laser devices and, more particularly, edge-emitting laser diodes having mirror facet passivation coatings that are conditioned using an "ex-situ" irradiation process in place of the conventional reduced current operation approach.

In accordance with the teachings and principles of the present invention, an external energy source is utilized to irradiate the material used as the facet passivation layer. The passivation layer should preferably be insulating (or low conducting). In particular, it may be formed using materials such as silicon, germanium or antimony. The irradiation process itself takes only seconds or a few minutes, compared to the extended hours of time required for the prior art "burn-in" conditioning process.

The external energy source may comprise a laser, flash lamp, electron beam, or other suitable radiation source. The energy source may be operated in either CW or pulsed fashion, where the passivation layer is irradiated with an irradiation dose sufficient to condition the complete thickness of the layer of passivation material. This ex-situ conditioning treatment is applied to facets of the laser diode and is preferably performed while the devices are in bar form (i.e., before dicing). However, it is to be understood that the inventive ex-situ conditioning process may also be applied to individual devices after dicing, performing ex-situ conditioning of either individual unmounted dies or mounted dies (e.g., devices mounted on cards, carriers, or submounts).

An exemplary ex-situ method of passivating facets of an edge-emitting laser diode in accordance with one or more embodiments of the present invention includes the following steps: a) depositing, in a reaction chamber, one or more layers of passivation materials on bare facet surfaces of the edge-emitting laser diode to form a facet coating of a predetermined thickness; b) removing the laser diode from the reaction chamber; and, c) irradiating the facet coating with a beam from an energy source for a period of time sufficient to condition the facet coating through the predetermined thickness. In an alternative method, the outer coating layers may be deposited over the passivation layers prior to performing the irradiation step (thus fully conditioning and providing stabilization of the combination of the passivation layer and coating layer).

Another embodiment of the present invention takes the form of an edge-emitting laser diode comprising a semiconductor substrate having a waveguide structure formed thereon for generating light at an operating wavelength, a pair of cleaved facets formed on opposing faces of the waveguide structure, passivation layers of a predetermined thickness formed to cover the pair of cleaved facets, wherein the passivation layers are fully conditioned through the predetermined thickness, and a reflective coating formed directly over at least one of the passivation layers.

Further teachings of the present invention are directed to a system and method for performing the conditioning process when using a focused laser as the external energy source. According to the principles of the system and method, a three-axis alignment between the focused laser beam and quantum well location of the edge-emitting laser diode is performed, followed by an iterative processing of a "sacrificial" location to determine an optimum combination of focused laser power and radiation time interval (i.e. "process window") that provides conditioning in the most expedient manner for high volume manufacture.

Yet another exemplary embodiment of the present invention takes the form of a method of calibrating an ex-situ conditioning process utilizing a focused laser beam having a predetermined spot size to passivate facets of an edge-emitting laser diode. The method of training contains several steps performed as follows: a) mounting the edge-emitting laser diode on a multi-axis positioning system including separate x-, y- and z-direction stages; b) applying a sub-threshold positive current to the edge-emitting laser diode sufficient to generate electro-luminescence of an active region of the edge-emitting laser diode; c) translating the x-direction stage of the multi-axis positioning system until a maximum brightness of the generated electro-luminescence is centered, defining x-direction alignment; d) activating a source of the focused laser beam to operate in a low power mode and applying a negative voltage across the edge-emitting laser diode to create a reverse-biased setting; e) irradiating the reverse-biased laser diode with the low-power focused laser beam to initiate a photocurrent output from the edge-emitting laser diode; f) translating one of the y-direction and z-direction stages of the multi-axis positioning system until a peak photocurrent reading is obtained; g) defining a first aligned position with the peak photocurrent reading; and h) repeating steps f) and g) for the remaining one of the y-direction and z-direction stages to determine a remaining aligned position.

Other and further embodiments and aspects of the present invention will become apparent during the course of the following discussion and by reference to the accompanying drawings.

DETAILED DESCRIPTION

As will be described in detail below, the present invention is directed to the utilization of an ex-situ process to fully condition the passivation layer used as a coating on exposed facets of a laser diode. Ex-situ is used here to emphasize the difference between conditioning as formed in accordance with the principles of the present invention (i.e., conditioning provided by using an external energy source) and the prior art "in-situ" conditioning achieved by operation of the laser diode device itself (typically at a reduced current level for an extended period of time). For the purposes of the present invention, the phrase "fully condition" primarily means to condition the material comprising the passivation layer (e.g., silicon, germanium, antimony) through the complete thickness of the layer. To "fully condition" can also be described for the purposes of the present invention as providing an ex-situ stabilization of the complete facet overlay, including both the passivation layer and a standard coating layer overlying the passivation layer (as well as all interfaces therebetween, such as the passivation film-chip interface).

As will be discussed below, the ex-situ approach of the present invention allows for the conditioning to be performed on a bar of laser diodes (prior to dicing into individual devices) thus significantly improving the efficiency of the process over the prior art product-by-product approach. Additionally, the ex-situ process of the present invention takes only a matter of seconds or minutes to perform, depending on the size/area to be treated, not the hours required by the conventional device-operated conditioning approach.

Figure 1:
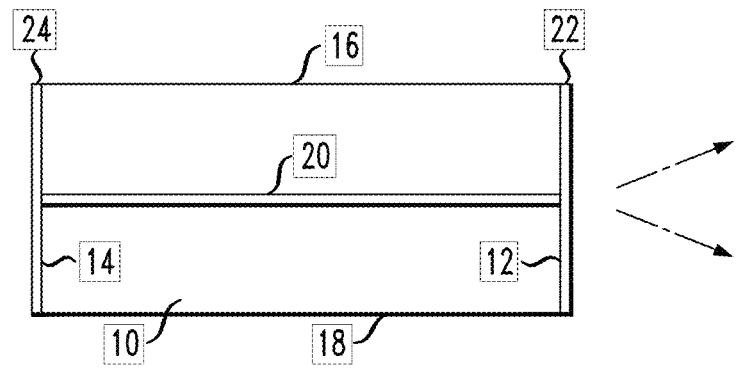
FIG. 1 is a schematic plan view of an edge-emitting semiconductor laser diode.

Turning now to the figures, an exemplary laser diode is schematically illustrated in the plan view of FIG. 1. The laser is formed in a semiconductor opto-electronic chip (or "bar") 10 having a front facet 12 and an opposing rear facet 14. Bar 10 includes a vertical structure (not shown in detail) that is typically composed of layers of AlGaAs, GaAs, and related III-V semiconductor materials epitaxially deposited on a GaAs substrate. However, it is to be understood that other material combinations are possible within the scope of the present invention.

In the commercial production of these devices, a large number of such bars are simultaneously formed on a single GaAs wafer, with the wafer then cleaved along natural cleavage planes to form a large number of separate bars 10 having the front and rear facets 12, 14, as well as the perpendicularly-arranged sides 16, 18, as shown in FIG. 1. The semiconductor processing performed on the wafer also forms a waveguide structure 20 extending between and perpendicular to facets 12, 14. While in most cases waveguide structure 20 is a ridge waveguide, other configurations are possible (e.g., a buried heterostructure waveguide, which may be preferred for high power applications). For many high power applications, waveguide structure 20 may have a width substantially larger than the lasing wavelength so as to form a broad-area laser.

As part of the fabrication process, cleaved facets 12, 14 are subjected to the conventional E2 passivation process. That is, bars 10 are loaded into a reaction chamber and passivation material(s) are deposited to a predetermined thickness to provide a coating over mirror surfaces of facets 12 and 14. The passivation materials need to be insulating (or low conducting), preferably comprising silicon, germanium, or antimony, and may also comprise any oxide or nitride of these materials. The as-deposited materials are shown as passivation layers 22, 24 in FIG. 1. It is at this point in the process that the ex-situ conditioning process of the present invention may be used.

Figure 2:
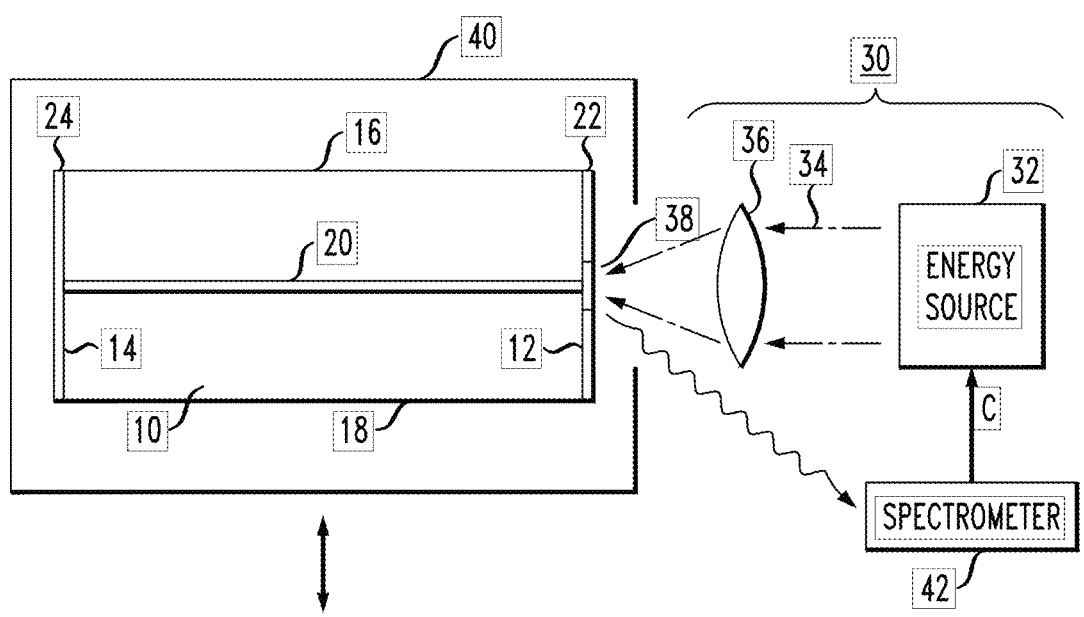
FIG. 2 shows an exemplary arrangement for performing ex-situ conditioning of laser diode passivation layers in accordance with one or more embodiments of the present invention.

In accordance with one or more embodiments of the present invention, conditioning of passivation layers 22, 24 is provided by an external system 30, as shown in FIG. 2. External system 30 includes an energy source 32 for generating a beam 34, which is typically in the visible range (e.g., 532 nm) but may also comprise a UV or IR beam. Energy source 32 may emit in either CW or pulsed mode. In the specific embodiment illustrated in FIG. 2, beam 34 from energy source 32 subsequently passes through a focusing lens 36 and scans along a portion 38 of passivation layer 22 which overlies an active region of the laser diode bar 10. Laser diode bar 10 may be mounted on a conventional sub-mount fixture 40 and moved with respect to the radiation from energy source 32 so that the focused beam is scanned across the lateral extent of passivation layer 22. Energy source 32 may comprise any radiation source capable of emitting radiation at an energy sufficient to create the desired homogeneous conditioning of the passivation material. In particular, energy source 32 may comprise a laser source, a flash lamp, an electron beam source, or any other system that creates a beam with an energy sufficient to condition passivation layer 22 through its complete thickness.

A spectrometer 42, also shown in FIG. 2, may be utilized to monitor the conditioning process. For example, scattered/redirected radiation from passivation layer 22 can be analyzed within spectrometer 42 using conventional means to determine the point in time when full conditioning has been achieved. Once the monitoring signal has leveled off, the external energy system may be de-activated.

It is to be understood that the same ex-situ radiation process can be used to fully condition passivation layer 24 along the opposite endface of the laser diode. Indeed, it is possible to configure a system where both facets are simultaneously conditioned. It has been found that the conditioning provided by this ex-situ irradiation process results in a homogeneous conditioning of the passivation materials through the complete thickness of the passivation layer. This is a clear advantage over the prior art process of activating the devices and performing the conditioning at a reduced power level, which has been found to result at times in a partial, inhomogeneous conditioning of the passivation materials.

Figure 3:
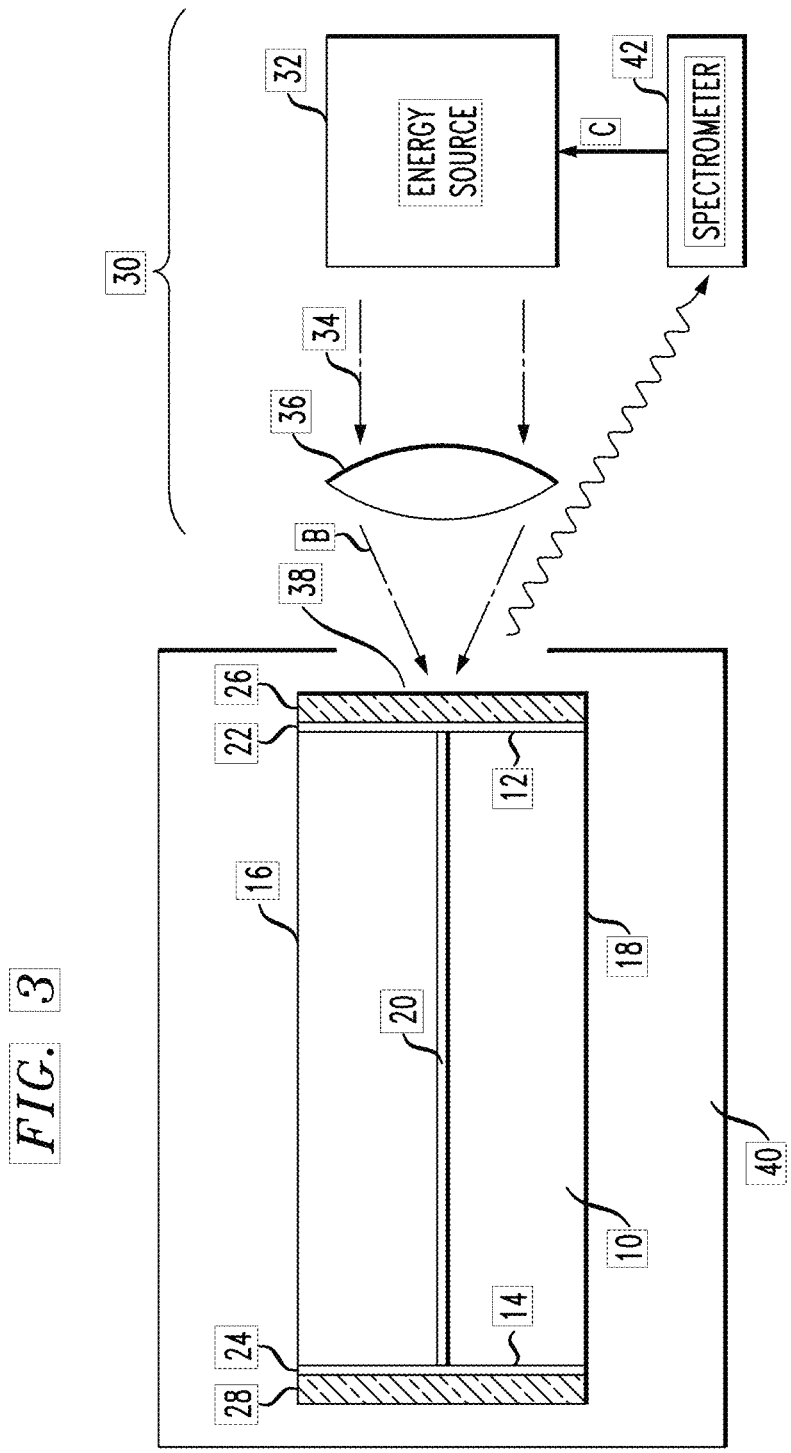
FIG. 3 shows an alternative arrangement for performing ex-situ conditioning, in this case providing full conditioning/stabilization of the passivation layers and overlying coating layers.

As mentioned above, it is also possible to perform the conditioning process of the present invention after both the passivation layers and reflective coating layers have been applied over the laser facets. FIG. 3 illustrates an exemplary laser diode, similar in structure to the configuration shown in FIG. 1, but in this case further processed to deposit a first coating layer 26 over passivation layer 22 and a second coating layer 28 over passivation layer 24. In most cases, silicon nitride is used as coating layers 26, 28. Other suitable coating materials include, but are not limited to, silicon, germanium, gallium arsenide, silicon oxide, aluminum oxide, titanium oxide, aluminum nitride, and tantalum oxide.

Similar to the embodiment of FIG. 1, energy source 30 is used to irradiate both coating layer 26 and underlying passivation layer 22 so as to fully condition and stabilize the laser diode structure. Under irradiation, the structures of both the coating and passivation layers change in a manner that stabilizes the device and results in creating the required high COD levels. For example, when silicon nitride is used as the coating material, the silicon nitride remains amorphous during irradiation (as opposed to crystallizing), but the atomic configurations in the nitride material does change. At the same time, this irradiation crystallizes the passivation layer and forms an interface between the passivation layer and the chip.

Thus, in accordance with this FIG. 3 embodiment of the present invention, the phrase "fully condition" means to structurally change the coating layer, crystallize the passivation layer, and create an interface between the laser chip and the passivation layer. The ex-situ conditioning process of the present invention can therefore be thought of as "stabilizing" the laser diode itself by virtue of the changes made to these layers.

Figure 4:
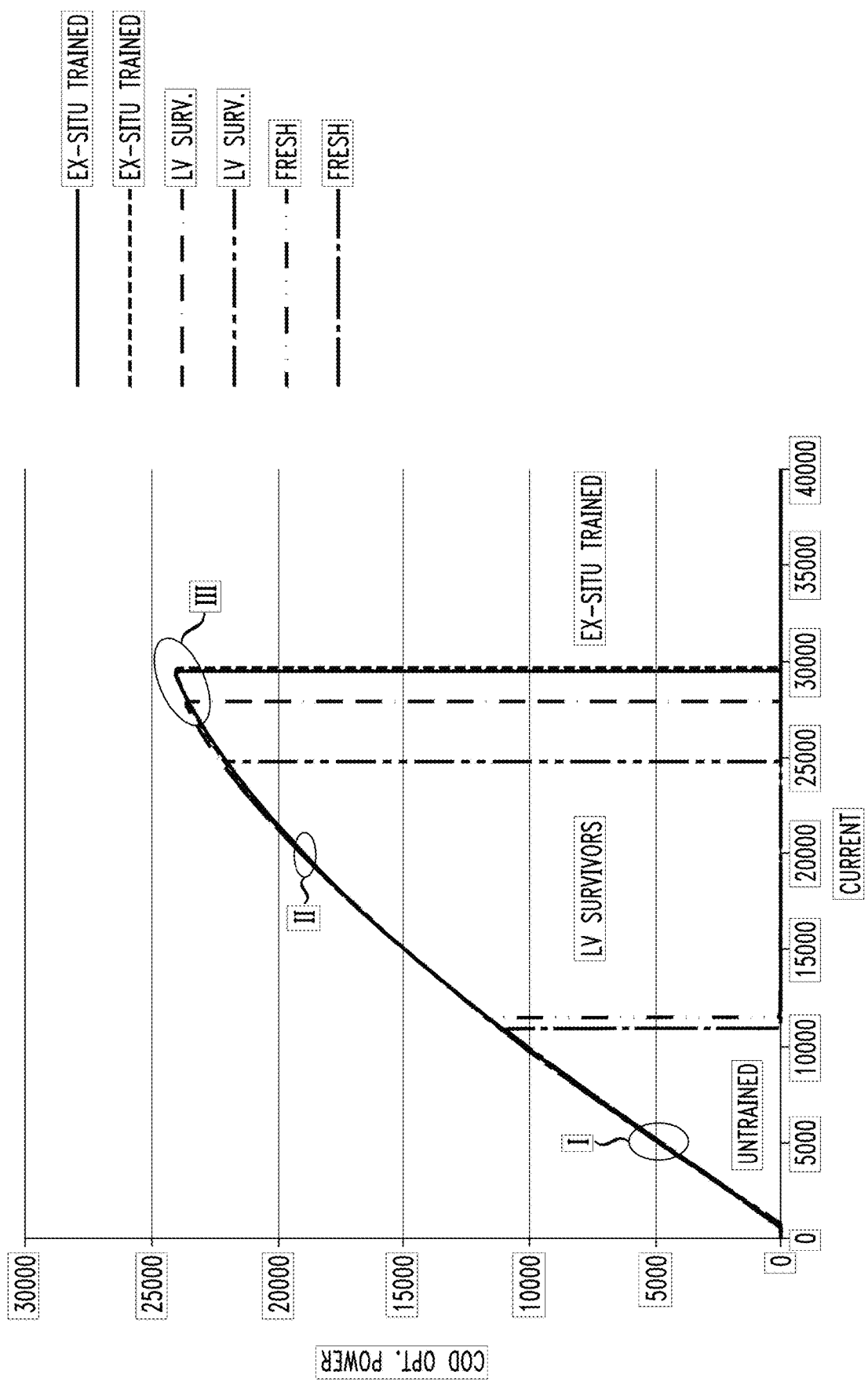
FIG. 4 contains a set of plots, showing the improvement in COD by using ex-situ conditioning in accordance with the present invention.

The COD current of devices formed in accordance with the present invention has been compared against devices using the conventional burn-in process. It is recalled that "COD current" is defined as the current at which the laser facet experiences catastrophic optical damage. FIG. 4 illustrates the results of this comparison. In particular, FIG. 4 contains a set of plots I showing the COD power as a function of current for devices that have been subjected only to the conventional E2 process (without any post-process conditioning). Plots II are associated with devices created using the same prior art E2 process, followed by the conventional "in-situ" conditioning process of operating the devices at low current/power levels. Clearly, the performance of these conditioned devices exceeds those in the first group, with much higher COD levels. Plots III are associated with devices formed in accordance with the present invention; that is, using an ex-situ conditioning process to provide full conditioning of the passivation layers. In particular, the results shown in FIG. 4 were obtained from devices formed in accordance with the embodiment discussed above in association with FIG. 3, where the ex-situ conditioning process was formed to stabilize both the coating and passivation layers.

It is observed that the devices formed in accordance with the present invention exhibit a somewhat higher level of COD than those of the prior art. While this is clearly one goal of the present invention, the fact that full conditioning can be performed on the complete laser bar (instead of at the individual device level) is also significant and a great improvement over the prior art. Moreover, the inventive ex-situ conditioning process is orders of magnitude more efficient than the standard burn-in process, able to fully condition/stabilize the structure in a matter of seconds or minutes, in comparison to the tens to hundreds of hours required for low-current level burn-in.

Advantageously, the ex-situ conditioning process may be initially trained to ascertain an optimum set of operating conditions (in terms of, for example, the "irradiation dose" used by the external energy source). In particular, the present invention is further related to an exemplary process and system for training an ex-situ conditioning system that utilizes a focused laser beam as the external energy source. The exemplary process addresses the need to crystallize the passivation layer through its complete thickness in the area overlying the active region of the edge-emitting laser diode while also eliminating vertical and lateral crystal inhomogeneities. The ex-situ conditioning process also needs to be robust and repeatable so that it may be of use in high volume production situations, while also efficiently perform the stabilization (i.e., increase process speed) without causing any damage to the device itself.

In accordance with the principles of the present invention, a method and system for initially calibrating (also referred to herein at times as "training") an ex-situ conditioning system are proposed, which results in allowing for the desired results of efficiency and accuracy to be achieved.

More particularly, an exemplary system and method for calibrating an ex-situ conditioning system that utilizes a focused laser beam as the external energy source includes the operations of: (1) aligning the spot size of the focused laser beam on the quantum well structure of the edge-emitting laser diode (i.e., spatial alignment in all three directions); and (2) determining an optimum performance window (in terms of power density and exposure interval) for the ex-situ conditioning process itself. As will be described in detail below, electro-luminescence and photo-current measurements of the edge-emitting laser diode are used to accurately alignment the focused spot beam from the process laser to the quantum well active region of the edge-emitting laser diode. Dark current measurements of the laser diode (which may be determined by operating in reverse bias near breakdown) are then utilized to ascertain the optimum power density and exposure settings for the process laser source used to perform the ex-situ conditioning.

Figure 5:
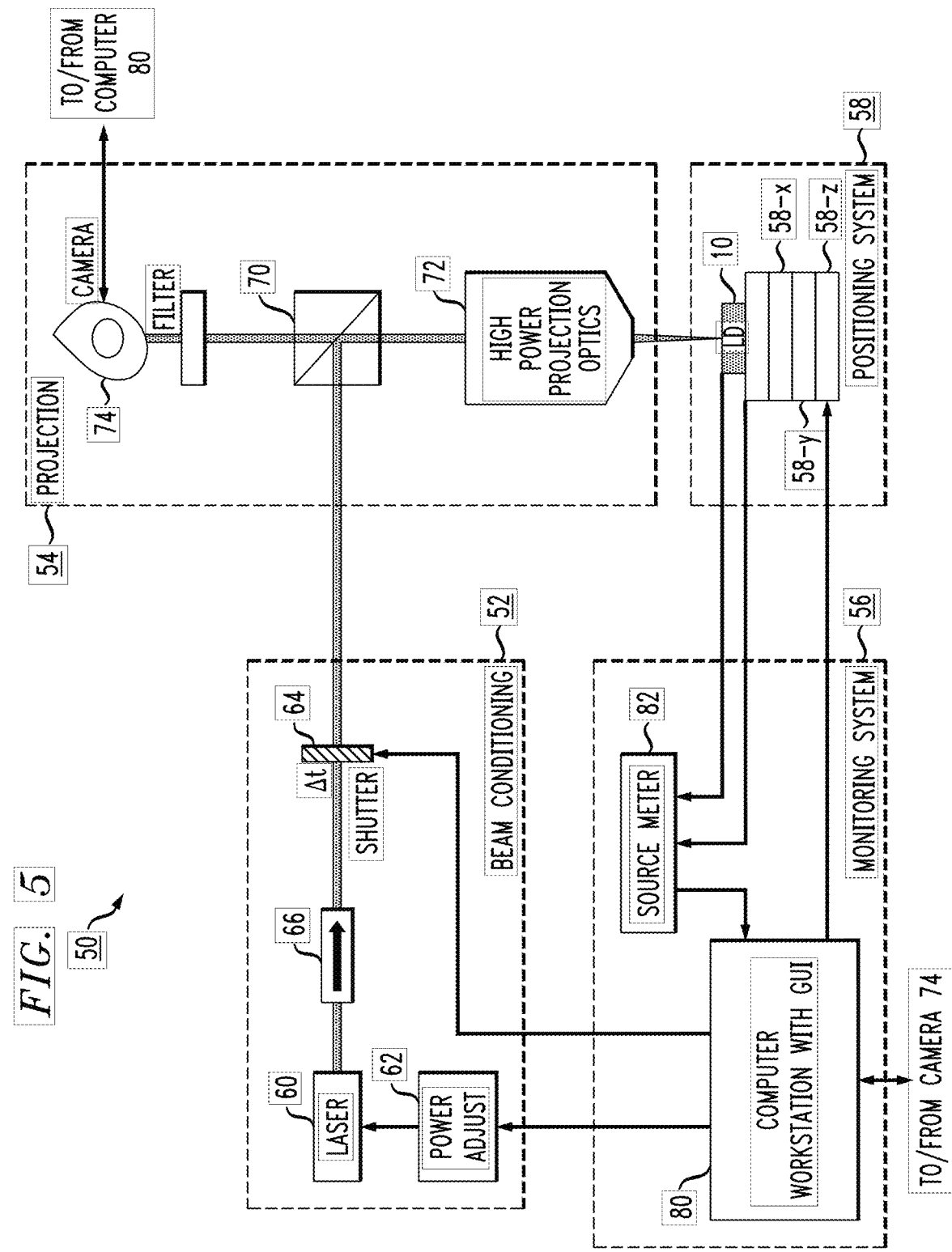
FIG. 5 illustrates, in block diagram form, an exemplary training system that may be used to calibrate an external energy source prior to initiating an ex-situ conditioning process.

FIG. 5 illustrates an exemplary training system 50 that can be used to calibrate a focused laser beam utilized to perform ex-situ conditioning of an edge-emitting laser diode. Training system 50 includes an external energy source 52, a projection system 54, and a monitoring system 56 that work together in the manner described in more detail below to ensure that the subsequent ex-situ conditioning process effectively conditions the complete thickness of the passivation layer in the most efficient manner possible. In particular, monitoring system 56 is utilized to control the movements of the separate translation stages (x, y, and z) forming a multi-axis positioning system 58 to provide the necessary x-y-z alignment. As will be discussed in detail below, monitoring system 56 further functions to determine an optimum process window, in terms of power density and radiation interval, for properly operating external energy source 52.

External energy source 52 is shown as comprising a process laser 60 that is configured to emit a beam at a given wavelength (here, selected to be 532 nm). A separate power adjustment component 62 is used to control the "dose" (power density) provided by process laser 60. Power adjustment component 62 responds to control signals from monitoring system 56 to tune the power level of the emitted laser beam. An exemplary range of output powers suitable for use in the ex-situ conditioning process may be about 10-10,000 mW, although other ranges are possible. An optical shutter 64 is included in external energy source 52 and functions to control the exposure time interval of the beam emitted from process laser 60. Again, the actual exposure interval Δt is set by monitoring system 56. Typical exposure intervals may range from as short as 0.1 s to 100 s (for example). Indeed, it is to be understood that the output power and exposure interval are inter-related variables, where the use of a higher power level may allow for the use of a shorter exposure interval (bearing in mind that too high a level or too long of an exposure may damage the device in a manner that is not repairable). Thus, an aspect of the present invention, as discussed in detail below, is to determine an optimum "process window" by applying various combinations of output power and exposure time interval at a sacrificial location away from the active portion of the structure so that any possible damage to the working portion of the laser is avoided. An optical isolator 66 is disposed in the signal path between process laser 60 and optical shutter 64 to prevent reflections from re-entering laser 60.

The controlled output radiation from external energy source 52 ("controlled" in terms of power density and exposure) is directed into projection system 54, as shown in FIG. 5. In particular, the output radiation is directed by a dichroic mirror 70 into a projection optics configuration 72 that provides focusing of the output radiation into a spot size that is useful for the purposes of radiating the portion of the passivation layer located over the laser diode bar's active region. In most cases, a spot size on the order of 2-5 µm is preferred. As will be explained in greater detail below, projection system 54 further comprises a camera 74 disposed in alignment with dichroic mirror 70 so that electroluminescence output from laser diode bar 10 will pass through projection optics 72, dichroic mirror 70, and arrive at camera 74 (which is configured to be responsive to both visible and IR radiation). This electro-luminescence is utilized by monitoring system 56 as part of a feedback loop in ascertaining optimum ex-situ conditioning process parameters.

Monitoring system 56 itself includes a controller module 80 and a source meter 82 that performs measurements and generates control signals for providing alignment between the focused spot beam from process laser 60 and mounted laser diode bar 10. In particular, controller module 80 provides separate movement signals that translate the separate motorized stages 58-x, 58-y, and 58-z of multi-axis positioning system 58 so as to provide this alignment. Monitoring system 56 also functions in the manner described below to determine the optimum process window for performing the conditioning of the passivation layer on laser diode bar 10.

Figure 6:
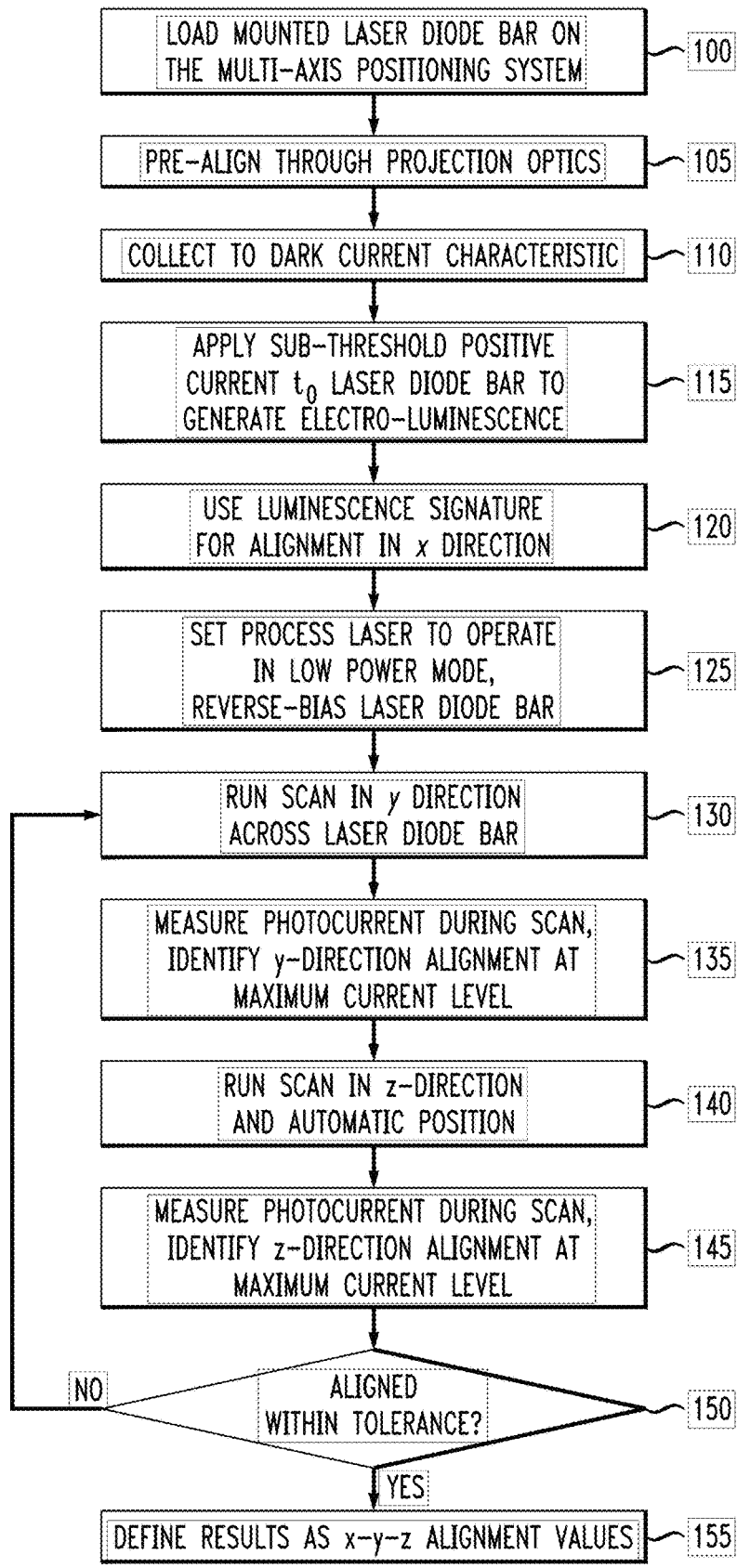
FIG. 6 is a flowchart of an exemplary alignment process utilized for positioning the external energy source with respect to the laser diode bar to be conditioned.

FIG. 6 contains a flowchart illustrating an exemplary alignment process, utilizing electro-luminescence and photocurrent measurements in accordance with the principles of the present invention to align the focused beam spot to the quantum well region of laser diode bar 10. The alignment process begins with loading mounted laser diode bar 10 onto multi-axis positioning system 58 (step 100). A preliminary alignment is next performed (step 105) by visual alignment using camera 74, where a user enters commands to controller module 80 to move various ones of the alignment stages. Once this initial alignment is achieved, an initial dark current measurement of laser diode bar 10 is performed (step 110). This initial dark current measurement is subsequently used as a starting point of the separate method of ascertaining an optimum process window. It is to be understood that there are various methods of measuring the dark current (including, for example, performing a measurement of the full reverse current-voltage characteristic, or alternatively performing a measurement at a specific voltage (say, for example −30V), the latter method preferred when attempting to ascertain a best process condition).

The alignment between the focused beam spot from process laser 60 and laser diode bar is then initiated by first performing an alignment along the x-axis direction of laser diode bar 10. To perform this alignment, source meter 82 applies a sub-threshold positive current (step 115) that is sufficient to forward bias laser diode bar 10 into a state where it generates an electro-luminescence signal. Sub-threshold currents in the range of, for example, 1-100 mA are suitable for this purpose. With reference to FIG. 5, projection system 54 is configured such that the electroluminescence is viewed by camera 74. Camera 74, in combination with controller module 80, moves stage 58-x of multi-axis system 58 to position the maximum luminescence region of laser diode bar 10 with the focused spot generated by process laser 60 (step 120). This steps thus defines the x-direction alignment between process laser 60 and the active region of laser diode bar 10.

Following this x-direction alignment, a photocurrent generated by laser diode bar 10 is used to perform the y-direction and z-direction alignments. In one exemplary embodiment, an iterative process is performed that utilizes a combination of a low-power output from process laser 60 and a reverse-biased state of laser diode bar 10 to generate a photocurrent that can be monitored to identify the optimum y- and z-direction alignments. Step 125 defines an initialization action where process laser 60 is instructed to operate in low power mode (as controlled by power adjustment component 62), and a negative voltage is applied across laser diode bar 10 by source meter 82 (i.e., to reverse-bias laser diode bar 10). A useful range of power for operating process laser 60 in a "low power mode" may be, for example 1-10 mW, with laser diode bar 10 reverse-biased by the application of a voltage in the range of, for example, 1-5 V.

Figure 7:
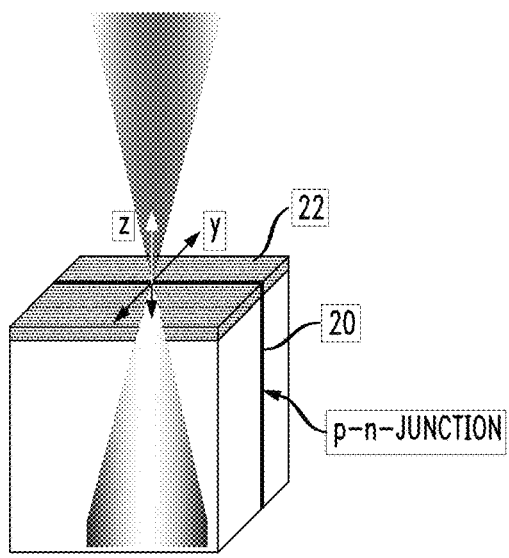
FIG. 7 illustrates an exemplary laser diode bar, depicting the y-z reference directions utilized in performing the alignment process outlined in FIG. 6.

In the particular process shown in the flowchart of FIG. 6, the y-axis direction alignment is first performed, followed by the z-direction alignment (the z-direction between the axial direction defining the optical signal axis). Since the steps involved in providing the z-axis alignment involve movement of the group of translation stages, the y-direction alignment may be slightly perturbed. Thus, the process loops back to perform a second y-direction alignment (followed by a second z-direction alignment), with the looping continuing until both the y- and z-direction alignments are within an acceptable tolerance. FIG. 7 is an illustration of an exemplary laser diode bar 10, showing the orientations of the y-direction and z-direction facet geometry.

Figure 8:
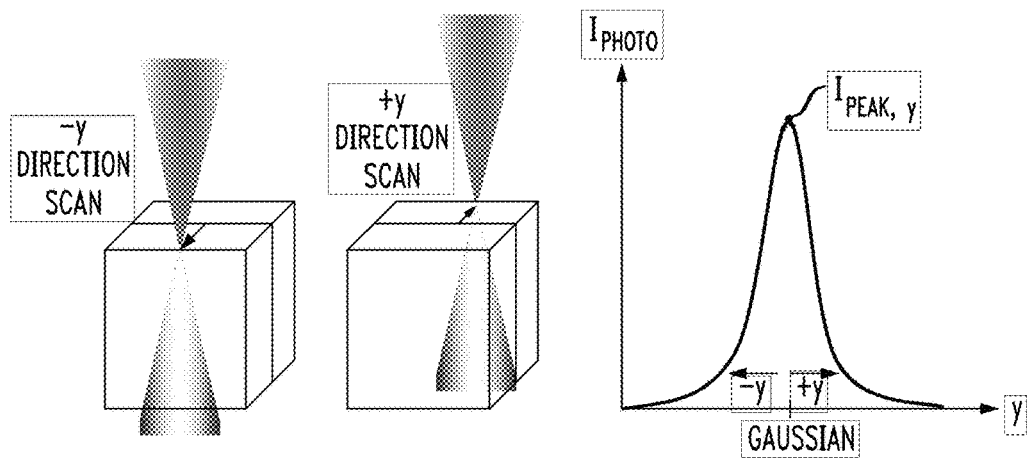
FIG. 8 illustrates an exemplary y-direction scan, performed as part of the process outlined in FIG. 6.

Referring to FIG. 6, therefore, this y-z alignment begins by moving reverse-biased laser diode 10 in the y-direction across the path of the low power process laser beam (step 130). Controller module 80 performs this step by sending a control signal to stage 58-y of multi-axis positioning system 58. The low power illumination of facet 12 generates a photocurrent ($I_{photo}$) through laser diode bar 10 that is measured by source meter 82 (step 135). FIG. 8 illustrates an exemplary y-direction scan (in both +y and -y directions), as well as a plot of the photocurrent measured by source meter 82. Since the intensity of the low power beam has a Gaussian profile, the photocurrent race as shown in FIG. 8 exhibits a Gaussian profile as well. The peak value of the measured photocurrent, denoted $I_{peak,y}$, is determined by controller module 80 and the corresponding position of the y-direction translation stage 58-y of positioning system 58 is initially identified as the y-direction alignment location.

Figure 9:
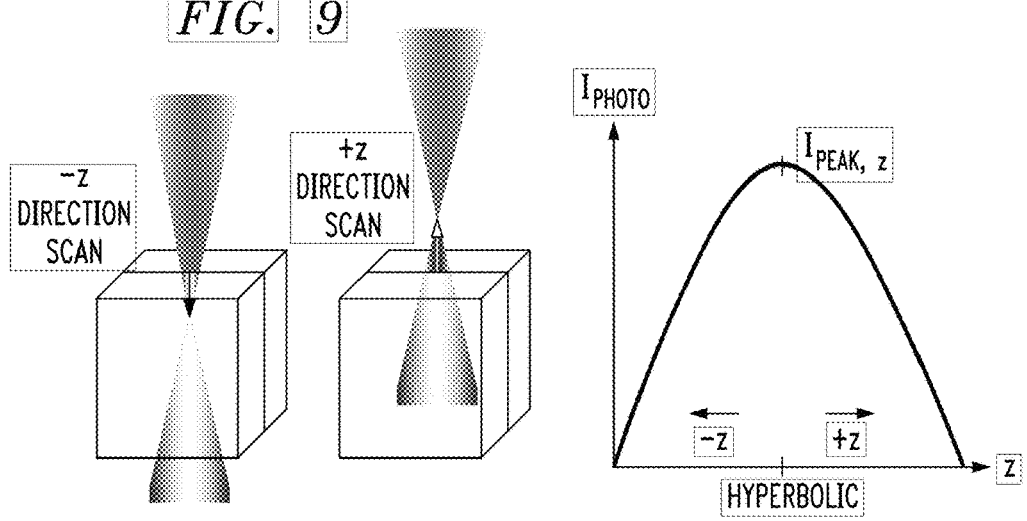
FIG. 9 illustrates z-direction movements of the laser diode bar with respect to the low-power beam emitted from the external energy source.

While maintaining this y-direction position, the alignment process continues by performing a z-direction alignment (step 140). The z-direction alignment is performed such that facet 12 of laser diode bar 10 rests in the focal point of the focused spot beam. Therefore, the z-direction alignment requires the movement of system 58 "up" and "down" along the optical axis of the system (again, using controller module 80 to direct the movement of the z-direction stage 58-z of positioning system 58). FIG. 9 illustrates the z-direction movements between the low power output beam from process laser 60 and laser diode bar 10, as well as the photocurrent measured during this z-direction scan (step 145). In this direction, the beam exhibits a hyperbolic intensity distribution and thus traces a hyperbolic photocurrent curve in the z-direction as shown in FIG. 9. In accordance with the principles of the presence invention, an optimum z-direction alignment is associated with the maximum dark current value, shown as $I_{peak,z}$ in FIG. 9. At this location, the focal point of the process beam is located at facet 12.

As mentioned above, this y-z alignment is preferably an iterative process. As such, the next step in the flowchart of FIG. 6 is a determination to make sure that the maximum photocurrent (within a specified tolerance) has been maintained after both y-direction and z-direction alignments (step 150). If the maximum photocurrent values are not within tolerance, the process loops back to step 130 to initiate another y-z alignment process. Once the photocurrent is within the specified tolerance, the set of x-y-z direction alignment stage locations are fixed (step 155) and defined as the optimum position for having the focused spot beam from process laser 60 aligned with the active region of laser diode bar 10.

In accordance with the principles of the present invention, the inventive system and method next determines a "process window" (in terms of power density and exposure interval) that most efficiently and effectively provides ex-situ conditioning of the passivation layer covering laser diode bar 10. While setting process laser 60 to have a relatively large spot size has the advantage of scaling to a larger sample population, this comes at the cost of requiring a higher power source (or the use of a pulsed source). If the power of a "dose" of radiation used for conditioning is too high, it may create material damage to the laser diode bar that cannot be easily detected by a visual inspection. Thus, it is important to find an appropriate process window that avoids the possibility of creating this type of damage.

Thus, it is proposed in accordance with the calibration process of the present invention, to measure dark current values at a "sacrificial" location distanced from the previously-defined aligned location where the actual conditioning process will be used. The operating parameters of process laser 60 are "tuned"/adjusted over a wide range of values, and the dark current generated by laser diode bar 10 is measured at each value over the tuning range. A known range of dark current values is associated with the operating region where crystallization of the passivation layer will occur. Therefore, as shown below in FIG. 10, a set of incremental changes in operating parameters are used to identify this dark current region and determine optimum values for power density and exposure.

Figure 10:
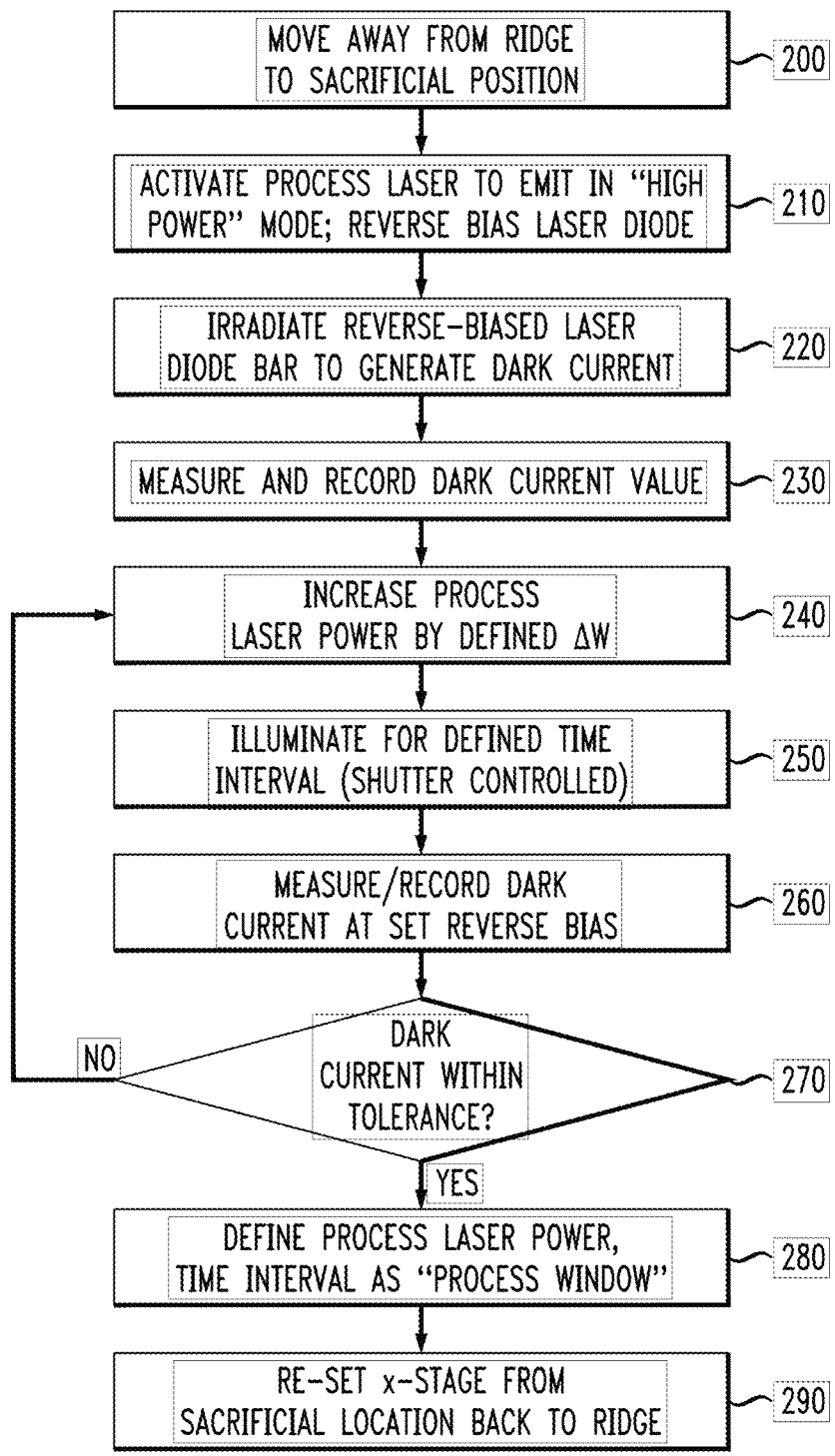
FIG. 10 contains a flowchart associated with one method of determining an optimum process window (power density, exposure interval) for performing efficient ex-situ conditioning in accordance with the principles of the present invention.
Figure 11:
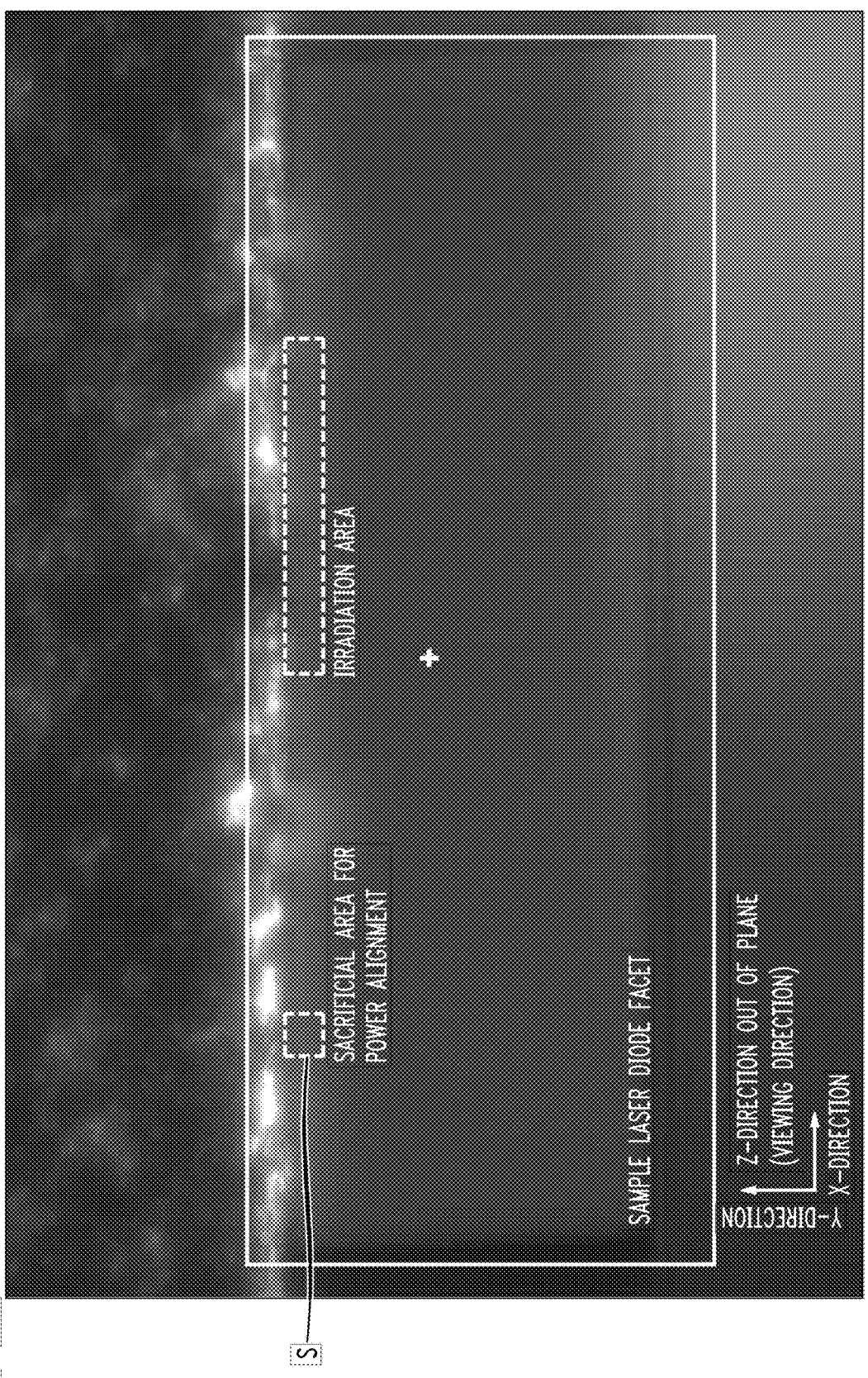
FIG. 11 is a photograph of a laser diode bar, illustrating the shift to a sacrificial location for performing the steps associated with determining an optimum process window.

FIG. 10 contains an exemplary flowchart associated with a method of finding an optimum process window in accordance with the teachings of the present invention. In this specific method, the exposure is held constant (i.e., set for a predefined time interval), and the output power from process laser 60 is incremented in value over a given range. The first step in this process, identified as step 200, resets the position of process laser 60 within respect to laser diode bar 10. In particular, laser diode bar 10 is shifted in the x-axis direction away from the ridge of laser diode bar 10 to a "sacrificial" position where testing of various radiation doses may be performed without causing material damage to the working area of the laser diode bar. FIG. 11 is a photograph of an actual laser diode bar undergoing this process, and indicates the location of a sacrificial area S used to perform the power adjustment steps. Thus, by using a sacrificial region, the power adjustment process is able to successfully find the optimum value to be used in the subsequent ex-situ conditioning process without disturbing the physical (material) properties of the actual location where conditioning is to ultimately be performed.

As with the process flow discussed above in association with FIG. 6, the flowchart of FIG. 10 shows how controller module 80 functions to direct the various elements of training system 50 to ascertain the optimum process window for performing conditioning in an efficient and effective manner. Continuing with reference to FIG. 10, the process continues by having external energy source 52 activated (now set in "high" power mode utilized for conditioning the passivation layer, having an output power in the range of, for example, 10-10,000 mW) to emit a beam of a first, known power (as set by power adjustment component 62) and for an emission interval controlled by the setting of shutter 64 (step 210). Thus, external energy source 52 is configured to create an initial "dose" of radiation to be used for a first trial conditioning process at the sacrificial region of laser diode bar 10.

Laser diode bar 10 is reverse-biased and the irradiation from external energy source 52 generates a dark current (step 220), which is measured by source meter 82 and stored in controller module 80 (step 230). Controller module 80 then functions, as shown in step 240, to increase the power of process laser 60 by a defined incremental step size $\Delta W$ (by sending a control signal to power adjustment element 62 to slightly increase the emitted power). The sacrificial region of laser diode bar 10 is then irradiated by this increased power for the set exposure interval (as controlled by optical shutter 64), step 250. Another dark current measurement is made (step 260) and an evaluation is performed (step 270) to determine if the dark current is within a defined tolerance associated of a value associated with crystallization of the passivation material. If not, the process returns to step 240, where the power of process laser 60 is increased by $\Delta W$, the sacrificial portion of laser diode bar 10 irradiated for the defined exposure at this higher power level, and another dark current measurement is made. The process continues to loop until the generated dark current is within the region associated with optimum conditions for crystallizing the passivation material. This set of conditions is defined as the "process window" (step 280) and the x-direction translation stage is activated to re-set the apparatus from the sacrificial region to the actual working region of the laser diode bar (step 290). As noted above, any suitable technique for measuring the dark current may be used, as along as the same technique is utilized for the entire process.

Figure 12:
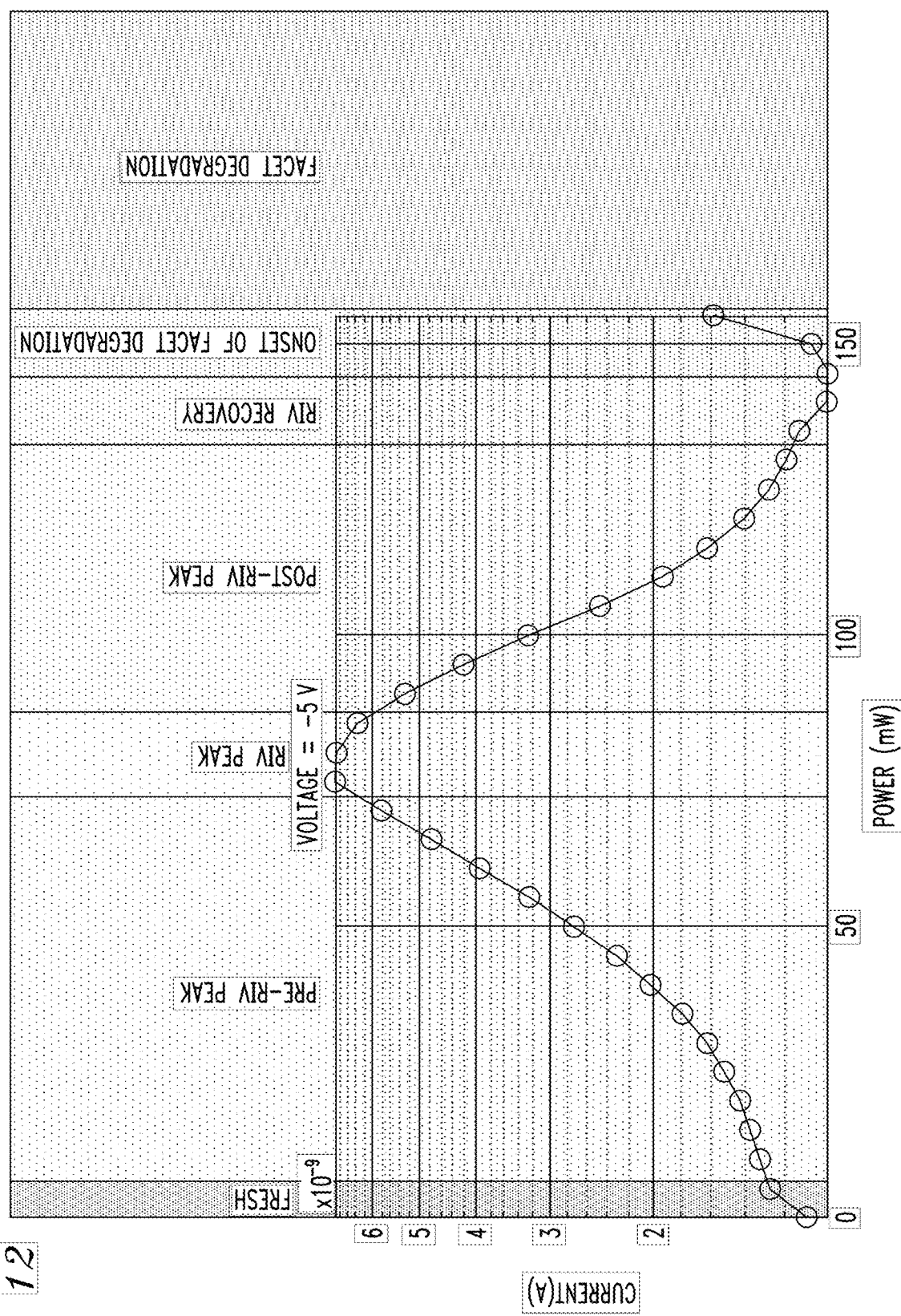
FIG. 12 is a graph of dark current as a function of emitted power of the external energy source.

FIG. 12 displays the dark current of laser diode bar 10 as a function of this input power adjustment process. Initially, the measured dark current passes through a region of increasing value, labeled as "pre-RIV peak" in FIG. 12. This section of the curve is associated with laser-induced implantation of silicon from the passivation layer into the body of semiconductor material. In a second region, identified as "post-RIV peak", the dark current is shown to reduce as the laser power increases. This decrease in dark current is associated with laser-induced intermixing in the bulk III-V semiconductor material. It is within this power region where crystallization of the passivation layer sets in and, therefore, the preferred operating power for process laser 60 is selected from the values identified with this region. For the sake of completeness, the dark current plot of FIG. 12 also shows a third region, associated with even higher power values. This third region is associated with facet degradation and, therefore, is to be avoided.

A continuous loop of increasing the power of source laser 60 and measuring the generated dark current is continued until the desired dark current value is obtained (within the defined tolerance interval). At this point, the laser power associated with providing this dark, in combination with the emission interval defined by shutter 64, are defined as the optimum "process window".

The system is then re-set to the predefined aligned position, and the conditioning process is initiated using the process window parameters that have been determined. While the specific steps associated with determining an effective and efficient process window described above utilize an adjust of the power supplied by process laser 60, another acceptable process may hold the power fixed and adjust the exposure time (using shutter 64) to find an optimum exposure interval for performing conditioning of the passivation layer. Indeed, it is possible to adjust both the radiation power and exposure time interval in a controlled manner to obtain an optimum process window condition.

Figure 13:
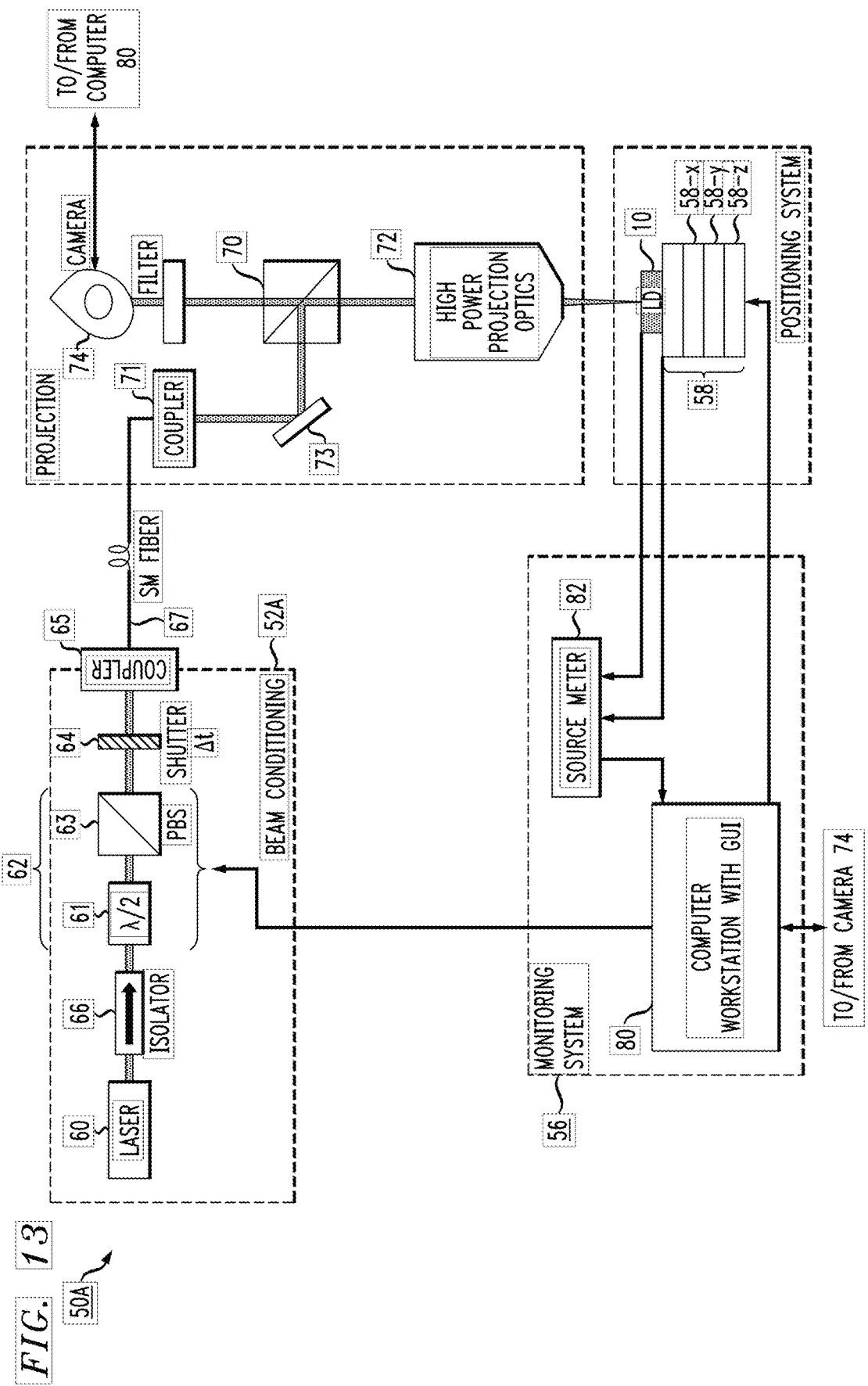
FIG. 13 is a block diagram of an exemplary configuration of the training system as shown in FIG. 5.

FIG. 13 illustrates one particular configuration of training system 50, here denoted as training system 50A. As shown, power adjustment component 62 in this configuration takes the form of a combination of a half-wave plate 61 and a polarization beam splitter 63 disposed in series between isolator 66 and optical shutter 64. In this configuration, half-wave plate 61 is mounted on a rotation stage (not shown), where the position of the rotation stage is adjusted by commands from controller module 80. The specific rotation of half-wave plate 61 adjusts the amount of optical energy (i.e., power) distributed between the orthogonal polarization states. Therefore, polarization beam splitter 63 will allow only one polarization to pass through shutter 64, and the amount of power in that polarization is controlled by the position of half-wave plate 61.

While the general arrangement of training system 50 as shown in FIG. 5 illustrates the output of external energy source 52 as a free space signal that is intercepted by dichroic mirror 70 of projection optics 54, in most practical applications external energy source 52 is somewhat remotely located with respect to the projection optics and laser diode device. FIG. 13 illustrates a particular embodiment of training system 50A, where in this embodiment the controlled output beam from shutter 64 is coupled into a single mode transmission fiber 67 (a coupler 65 shown as used to inject the controlled beam transmission fiber 67) that is disposed between external energy source 52 and projection optics 54. A second coupler 71 is shown as disposed at the opposite termination of transmission fiber 67, with second coupler 71 defined as a component in projection optics 54. In this case, the output from second coupler 71 is directed by a turning mirror 73 so as to intercept dichroic mirror 70 in the same manner as discussed above in association with the configuration of FIG. 5. While not particularly illustrated, the position of turning mirror 73 may be adjusted so that maximum coupling of the received beam is directed into dichroic mirror 70.

Regardless of the specific implementation of the training system, once external energy source 52 has been properly aligned and the optimum process window determined, the actual ex-situ conditioning is initiated. Therefore, in further accordance with the principles of the present invention, training system 50 may be used in a quality control manner, measuring dark current values and storing images of conditioned laser diode bars, with the ability to signal the need for adjustments in the process if any of the measured dark current values begin to move out of predetermined limits.

Figure 14:
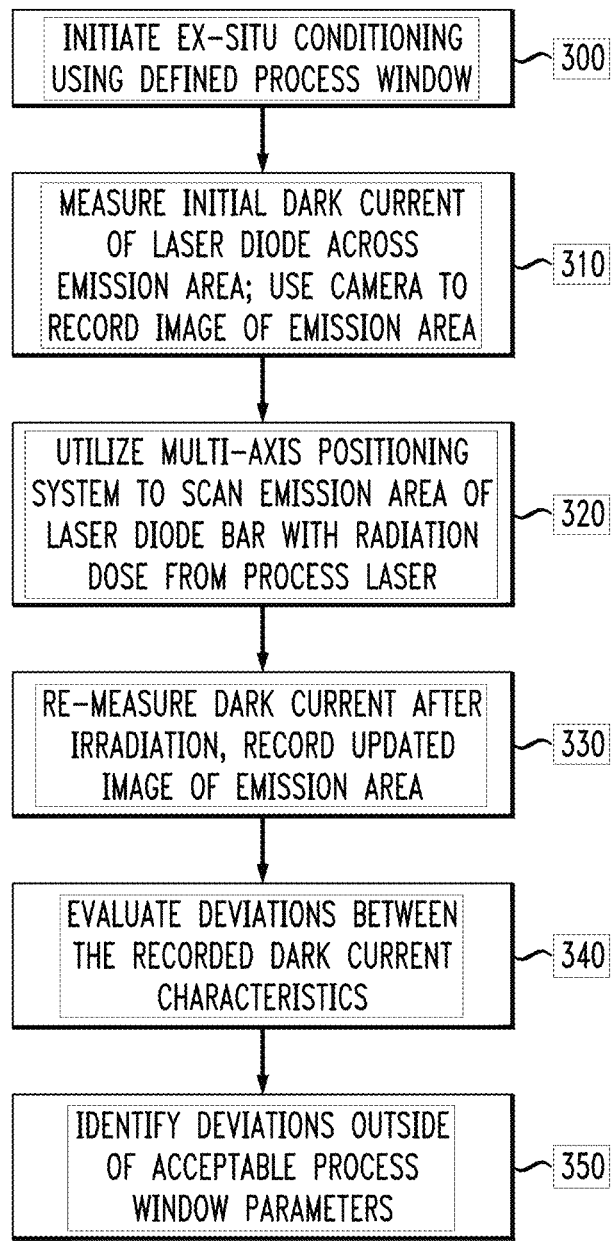
FIG. 14 is a flowchart of an exemplary process for utilizing the inventive training system as part of an on-going quality control monitoring system.

FIG. 14 contains a flowchart of an exemplary set of steps associated with this quality control monitoring process. Step 300 shows initiating the ex-situ conditioning process, using conditions identified in step 290 of the flowchart in FIG. 10. An initial dark current measurement of the laser diode bar is made, and camera 74 is used to record an image of this "initial" state of the laser diode bar (step 310).

The laser diode bar is then scanned across its active region (as controlled by movement of the x-direction stage 58-$x$ of multi-positioning system 58), denoted as step 320. An updated measurement of the dark current is next performed and an updated image of the emission area is made by camera 74 and stored in controller module 80 (step 330). Deviations between the "before radiation" and "after radiation" dark characteristics are evaluated by controller module 80 (step 340), and any results outside of acceptable results are recognized (step 350). As mentioned above, if the measured dark current is in region III (see FIG. 12), it is possible that damage to the facet may be occurring. This information can then be used to modify the process window to prevent further damage.

Summarizing, the process of the present invention has been found to homogeneously and fully condition the standard E2 passivation layer (as well as the overlying coating layer when present), eliminating the vertical and lateral conditioning inhomogeneity as found in the prior art. The inventive process is found to maximize the current level at which mirror damage occurs (i.e., the COD current/optical power) without burn-in. This eliminates the prior art's need to perform chip training by chip operation. The distribution of COD current within a production lot has also been found to be reduced.

Moreover, as mentioned above, it is possible to perform ex-situ full conditioning of laser facets at the bar level (i.e., before chip separation). This allows for the full conditioning of a large number of bars in a short period of time, as preferred for mass production situations. Indeed, the inventive approach also eliminates the need for a customer to perform any conditioning steps on the devices, as was the case in certain situations in the past.

It is to be understood that the principles of the present invention may be embodied in other specific forms without departing from its spirit or essential characteristics. The described embodiments are to be considered in all respects as only illustrative, not restrictive. The scope of the invention, therefore, is indicated by the appended claims rather than by the foregoing description. All changes that come within the meaning and range of equivalency of the claims are to be embraced within their scope.

What is claimed is:

1. A method of calibrating an ex-situ conditioning process utilizing a focused laser beam having a predetermined spot size to passivate facets of an edge-emitting laser diode, the method of training comprising:
   a) mounting the edge-emitting laser diode on a multi-axis positioning system including separate x-, y- and z-direction stages;
   b) applying a sub-threshold positive current to the edge-emitting laser diode sufficient to generate electro-luminescence of an active region of the edge-emitting laser diode;
   c) translating the x-direction stage of the multi-axis positioning system until a maximum brightness of the generated electro-luminescence is centered, defining x-direction alignment;
   d) activating a source of the focused laser beam to operate in a low power mode and applying a negative voltage across the edge-emitting laser diode to create a reverse-biased setting;
   e) irradiating the reverse-biased laser diode with the low-power focused laser beam to initiate a photocurrent output from the edge-emitting laser diode;
   f) translating one of the y-direction and z-direction stages of the multi-axis positioning system until a peak photocurrent reading is obtained;
   g) defining a first aligned position with the peak photocurrent reading;
   h) repeating steps f) and g) for the remaining one of the y-direction and z-direction stages to determine a remaining aligned position.

2. The method of claim 1 wherein steps f), g) and h) are performed in an iterative process until a predetermined peak photocurrent along both the y-direction and z-direction are obtained.

3. The method of claim 1, wherein in performing step d), the focused laser beam exhibits a predetermined spot size on the order of about 2-5 µm.

4. The method of claim 1, wherein in performing step d), the focused laser beam operates at a power within the range of about 1-10 mW.

5. The method of claim 1, wherein in performing step d), a negative voltage having a magnitude in the range of 1 to 5 V is applied across the edge-emitting laser diode.

6. The method as defined in claim 1 wherein the method further comprises the steps of:
   i) defining a range of dark current values required for creating crystallization of a passivation layer of the edge-emitting diode;
   j) translating the x-direction position of the edge-emitting laser diode to align the focused laser beam with a sacrificial region of the edge-emitting laser diode;
   k) setting the focused laser beam to operate at a first high-power level and generate output radiation for a first exposure interval;
   l) irradiating the sacrificial region of the edge-emitting laser diode with the focused laser beam of step k);
   m) measuring a dark current generated by the edge-emitting laser diode;
   n) if the measured dark current value is not within the defined range of step i), adjusting one or both of the high-power level and the exposure interval and repeating steps k) through m); otherwise, if the measured dark current value is within the defined range of step i),
   o) defining the power level and exposure interval associated with the dark current value within the defined region as an optimum process window for performing ex-situ conditioning.

7. The method as defined in claim 6, wherein in performing step n), the adjusting is performed by adjusting the high-power level of the focused laser beam and maintaining a constant exposure interval.

8. The method as defined in claim 6, wherein in performing step n), the adjusting is performing by adjusting the exposure interval and maintaining a constant high-power level.

9. The method as defined in claim 6, wherein in performing step k), the focused laser beam is set to operate at a first high-power level of at least 10 mW.

10. The method as defined in claim 6, wherein in performing step k), the focused laser beam is set to operate at a first exposure interval of at least 0.1 s.

11. A training system for calibrating an ex-situ conditioning system utilized to crystallize a passivation layer of an edge-emitting laser diode, the training system comprising:
   an external energy source including:

a process laser source, operating at a predetermined wavelength;

a power adjustment component coupled to the process laser source for controlling an output power level of the external energy source; and an optical shutter disposed beyond the output of the process laser source for controlling an exposure interval of an output beam from the external energy source;

a multi-axis positioning system for supporting the edge-emitting laser diode including a plurality of separate translation stages comprising an x-direction translation stage, a y-direction translation stage, and a z-direction translation stage;

a monitoring system coupled to both the external energy source and the multi-axis positioning system, the monitoring system controlling both: (1) movements of each translation stage of the plurality of separate translation stages to provide optical alignment between the external energy source and the edge-emitting laser diode; and (2) the output power level and the external energy interval of the external energy source; and a projection system disposed between the external energy source and the multi-axis positioning system, the projection system including a dichroic mirror for receiving and redirecting the output beam from the external energy source into a focused spot size on the edge-emitting laser diode; and a camera disposed in optical alignment with the dichroic mirror to receive emissions from the edge-emitting laser diode, the camera coupled to the monitoring system for providing alignment information.

12. The training system as defined in claim 11 wherein the external energy source further comprises an optical isolator disposed along a signal path at the output of the process laser source.

13. The training system as defined in claim 11 wherein the power adjustment component comprises a rotatable half-wave plate disposed at the output of the process laser source; and a polarization beam splitter disposed beyond the movable half-wave plate, where the orientation of the rotatable half-wave plate is controlled by a signal from the monitoring system to adjust a power level exiting the polarization beam splitter.

14. The training system as defined in claim 11, further comprising an optical fiber coupled between the external energy source and the projection system for supporting the propagation of the output beam.

* * * * *